US006922078B1

(12) United States Patent
Agrawal

(10) Patent No.: US 6,922,078 B1
(45) Date of Patent: Jul. 26, 2005

(54) PROGRAMMABLE LOGIC DEVICE WITH ENHANCED WIDE AND DEEP LOGIC CAPABILITY

(75) Inventor: Om P. Agrawal, Los Altos, CA (US)

(73) Assignee: Lattice Semiconductor Corporation, Hillsboro, OR (US)

(*) Notice: Subject to any disclaimer, the term of this patent is extended or adjusted under 35 U.S.C. 154(b) by 63 days.

(21) Appl. No.: 10/428,982

(22) Filed: May 1, 2003

(51) Int. Cl.[7] .................................... H03K 19/177
(52) U.S. Cl. ..................... 326/39; 326/38; 326/40; 326/41
(58) Field of Search ..................... 326/38, 39, 40, 326/41

(56) References Cited

U.S. PATENT DOCUMENTS

| | | | |
|---|---|---|---|
| 5,818,254 A | * 10/1998 | Agrawal et al. | 326/39 |
| 5,886,538 A | * 3/1999 | New | 326/40 |
| 5,966,027 A | * 10/1999 | Kapusta et al. | 326/39 |
| 6,034,541 A | * 3/2000 | Kopec et al. | 326/39 |
| 6,034,544 A | * 3/2000 | Agrawal et al. | 326/39 |
| 6,184,713 B1 | 2/2001 | Agrawal et al. | |

OTHER PUBLICATIONS

IspMACH 5000VG Family, 3.3V In–System Programmable SuperBIG, SuperWIDE High Density PLDs Datasheet, Lattice Semiconductor Corporation, Dec. 2001.

IspXPLD 5000MX Family, 3.3V, 2.5V and 1.8V In–System Programmable eXpanded Programmable Logic Device XPLD Family Datasheet, Lattice Semiconductor Corporation, Mar. 2003.

IspMACH 4000V/B/C/Z Family Data Sheet, Lattice Semiconductor Corporation, 2003, pp. 1–82, Mar. 2003.

U.S. patent application entitled "Multi–Stage Interconnect Architecture For Complex Programmable Logic Devices", given Ser. No. 10/428,888, filed on May 1, 2003.

U.S. patent application entitled "CPLD with Multi–Function Blocks And distributed Memory", given Ser. No. 10/428,889, filed on May 1, 2003.

U.S. patent application entitled "Cascaded Logic Block Architecture For Complex Programmable Logic Devices", given Ser. No. 10/428,885, filed on May 1, 2003.

* cited by examiner

Primary Examiner—Michael Tokar
Assistant Examiner—Lam T. Mai
(74) Attorney, Agent, or Firm—MacPherson Kwok Chen & Heid LLP

(57) ABSTRACT

A programmable logic device includes a plurality of logic blocks organized into a cluster. Each logic block may form product terms of a fixed input width. The cluster is configured to provide input width cascading between the blocks. In addition, the cluster is configured to provide depth cascading such that sum of all the product terms from one logic block may be cascaded to another.

20 Claims, 9 Drawing Sheets

PROGRAMMABLE LOGIC DEVICE WITH ENHANCED WIDE AND DEEP LOGIC CAPABILITY

TECHNICAL FIELD

The present invention relates generally to programmable logic devices. Specifically, the present invention relates to programmable logic devices having clustered logic blocks configured to provide enhanced wide and deep logic capability.

BACKGROUND

Programmable logic devices, such as a complex programmable logic device (CPLD), typically include a number of independent logic blocks interconnected by a global or centralized routing structure. For example, FIG. 1 illustrates a block diagram of a conventional CPLD 10 that includes a routing structure 100 and sixteen logic blocks 102, with each logic block 102 having 16 macrocells (not illustrated) and receiving 36 inputs from routing structure 100. The architecture of the logic block and of the routing structure (or interconnect) are two significant factors that determine the density, performance, and scalability of a CPLD.

Each logic block 102 in conventional CPLD 10 includes a programmable AND array (not illustrated) that a user configures to provide product term outputs of the true and complement form of the logical inputs received from routing structure 100. The product terms may be summed and the resulting sum of product terms registered in the macrocells within each logic block 102. The number of logical inputs that may factor into each product term is referred to as the "input width" for a given logic block and is fixed by the routing structure configuration. With respect to FIG. 1, the input width for logic blocks 102 is thirty-six. Another metric for a logic block is its depth, which is determined by the number of product terms that may be summed and registered within each macrocell. Just like the input width, the depth is fixed according to the configuration of a given macrocell.

Users often require relatively wide input logic blocks providing a high density of macrocells to implement complex functions such as decoders. However, as just described, conventional CPLD logic blocks are implemented with a fixed input width such that users may achieve a higher input width only by cascading product terms through the routing structure. Turning now to FIG. 2a, logic block 102a provide a product term having an input width of 36 logical variables to routing structure 100 to be routed to logic block 102b. At logic block 102b, the cascaded product term may be "ANDed" with 35 additional logical inputs to provide a product term having an input width of 71 logical variables. In turn, the product term outputs from logic block 102b may be cascaded through routing structure 100 and "ANDed" with 35 additional logical inputs in logic block 102c to provide a product term output having an input width of 106 logical variables. Finally, the product term output from logic block 102c may be cascaded through routing structure 100 and "ANDed" with 35 additional logical inputs in logic block 102d to provide a product term output having an input width of 141 logical variables.

In a similar fashion, sum of product term outputs may be cascaded through the routing structure to provide greater logic depth. Turning now to FIG. 2b, logic blocks 102a–d each have a fixed product term depth of 80 product terms. Thus, sums of up to 80 product term outputs from logic block 102a may be routed through routing structure 100 to the macrocells (not illustrated) in logic block 102b. In this fashion, sums of up to 160 product term outputs from logic block 102b may be routed through routing structure 100 to logic block 102c, which in turn may provide sums of up to 240 product term outputs to logic block 102d. Logic block 102d may thus provide sums of up to 320 product term outputs.

Although the width and depth cascading discussed with respect to FIGS. 2a and 2b provides greater flexibility to users, this flexibility is associated with routing structure burdens and routing structure delays. Accordingly, there is a need in the art for logic blocks having enhanced width and depth cascading.

SUMMARY

In accordance with one aspect of the invention, a programmable logic device includes a plurality of logic blocks. Each logic block includes a programmable AND array to provide product terms from a plurality of logical inputs coupled from a routing structure. In addition, each logic block includes a plurality of macrocells, wherein each macrocell includes a product term cluster OR gate for summing a cluster of product terms provided by the programmable AND array. Logic circuitry is configured to provide inter-logic-block input width cascading such that the logic input width for the sum of the cluster of product terms corresponding to each macrocell may be incremented by the plurality of logical inputs by directly coupling product terms from one logic block's macrocell to another logic block's macrocell.

In accordance with another aspect of the invention, a programmable logic device includes a plurality of logic blocks, wherein each logic block includes a programmable AND array for forming product terms using a plurality of X logical inputs, and wherein each logic block includes a plurality of macrocells, each macrocell including an N-input OR gate for summing N product terms received from the programmable AND array. A means for input-width cascading between the logic blocks is configured such that the input width of the product terms summed by each N-input OR gate may be increased by increments of X logical inputs by directly coupling product terms between macrocells. A means for depth cascading between the logic blocks is configured such that the sum of N product terms from each macrocell may be incremented in N product term increments.

BRIEF DESCRIPTION OF THE DRAWINGS

Use of the same reference symbols in different figures indicates similar or identical items.

DETAILED DESCRIPTION

Figure 3:
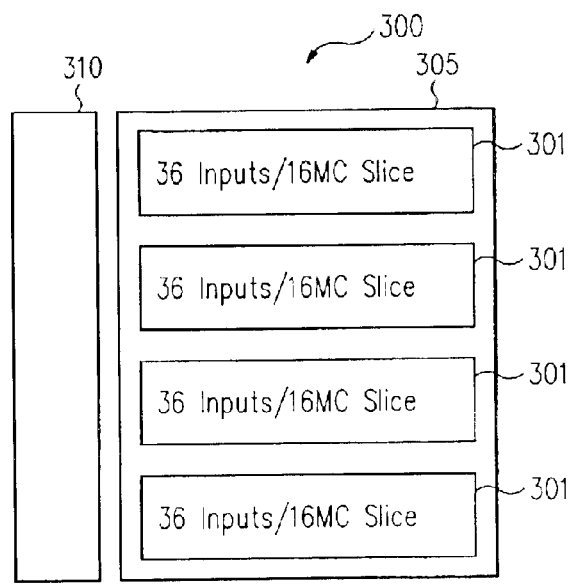
FIG. 3 is a block diagram of a cluster of logic blocks according to one embodiment of the invention.

FIG. 3 illustrates a programmable logic device architecture 300 providing enhanced width and depth cascading. A plurality of logic blocks 301 are organized into a cluster 305. Although four logic blocks 301 are shown within cluster 305, any suitable plurality may be chosen such as two, three, four, or eight logic blocks 301 per cluster 305. Each logic block 301 includes a plurality of macrocells (discussed with respect to FIG. 4) configured to register product terms or sums of product terms. In turn, the product terms are formed from a set of inputs provided by a routing structure 310. The number of macrocells within each logic block 301 and the inputs received by each logic block 301 is arbitrary and may be varied according to the requirements of a particular implementation. In the embodiment illustrated in FIG. 3, each logic block 301 has 16 macrocells and receives 36 logical inputs from routing structure 310. From the logical inputs received from the routing structure, a programmable AND array (discussed with respect to FIGS. 4 and 5) forms a plurality of product terms. Each macrocell may register a sum of a certain number of these product terms, for example, 5 product terms. In turn, this drives the total number of product term outputs from the logic block's programmable AND array. Assuming that 5 product terms may be summed at each macrocell, a total of 80 product terms per logic block 301 should be available from the programmable AND array (5 product terms for each of 16 macrocells). Additional product terms may be required for control and related functions.

Figure 4:
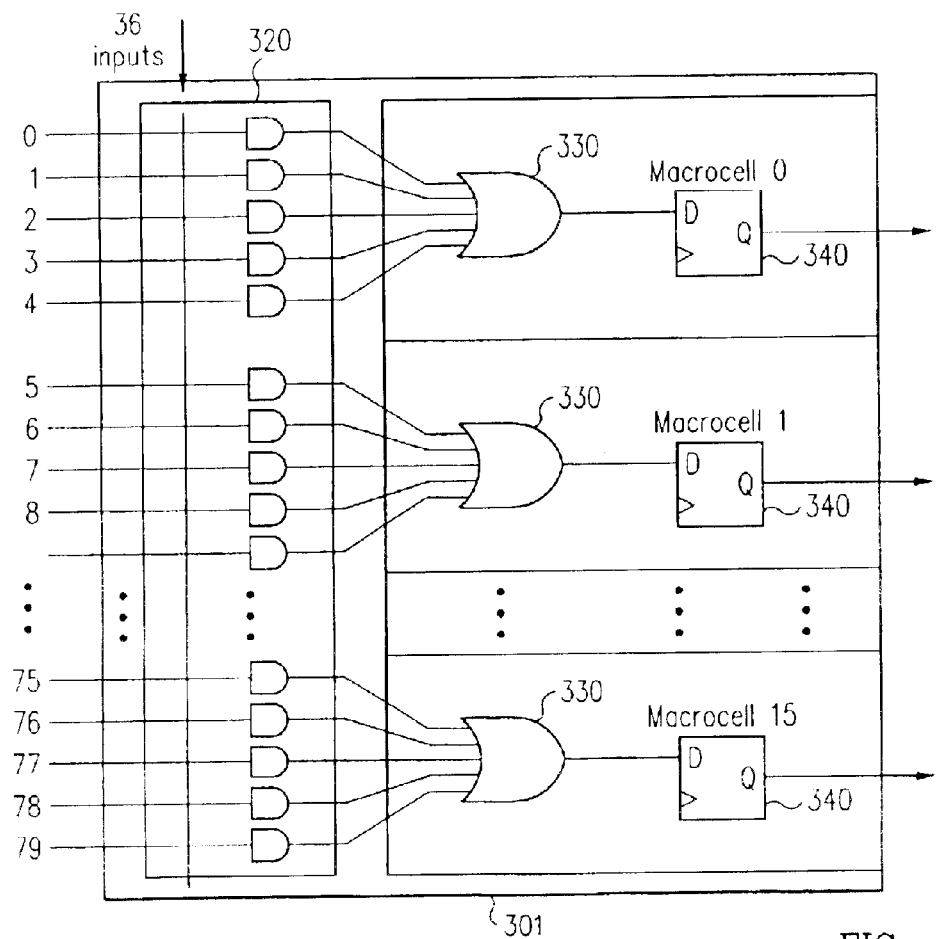
FIG. 4 is a block diagram for a logic block of FIG. 3.
Figure 5:
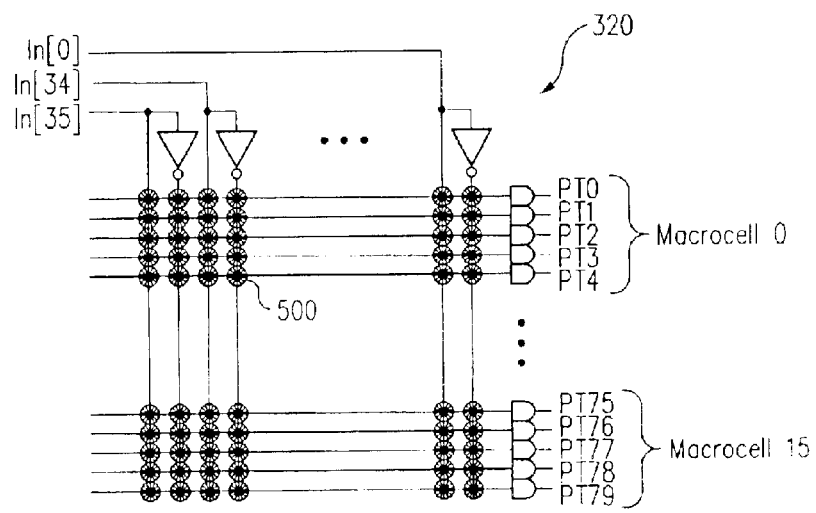
FIG. 5 illustrates the architecture for the programmable AND array in the logic block of FIG. 4.

Turning now to FIG. 4, a high-level block diagram for a logic block 301 is illustrated. Programmable AND array 320 receives the 36 inputs from routing structure 310 (FIG. 3). These inputs may be programmably fused into the 80 product term outputs (numbered 0 through 79) from AND array 320. A more detailed block diagram of programmable AND array 320 is shown in FIG. 5. The true and complement form of the 36 inputs (numbered In[0] through In[35]) are received at 72 fuse points 500 for each product term output (numbered PT0 through PT79). Should a particular fuse point 500 be activated for a given product term output, the corresponding true or complement input will factor into the product term output. The product terms are organized into 16 groups of five each, corresponding to the 16 macrocells. Referring back to FIG. 4, a 5-input OR gate 330 within each macrocell may sum its corresponding group of 5 product terms. Thus, macrocell 0 may sum product term 0 through 4, macrocell 1 may sum product term outputs 5 through 8, and so on. A D-type flipflop 340 within each macrocell may then register the sum of products from its corresponding OR gate 330.

Intra-Block Depth Cascading

Figure 6:
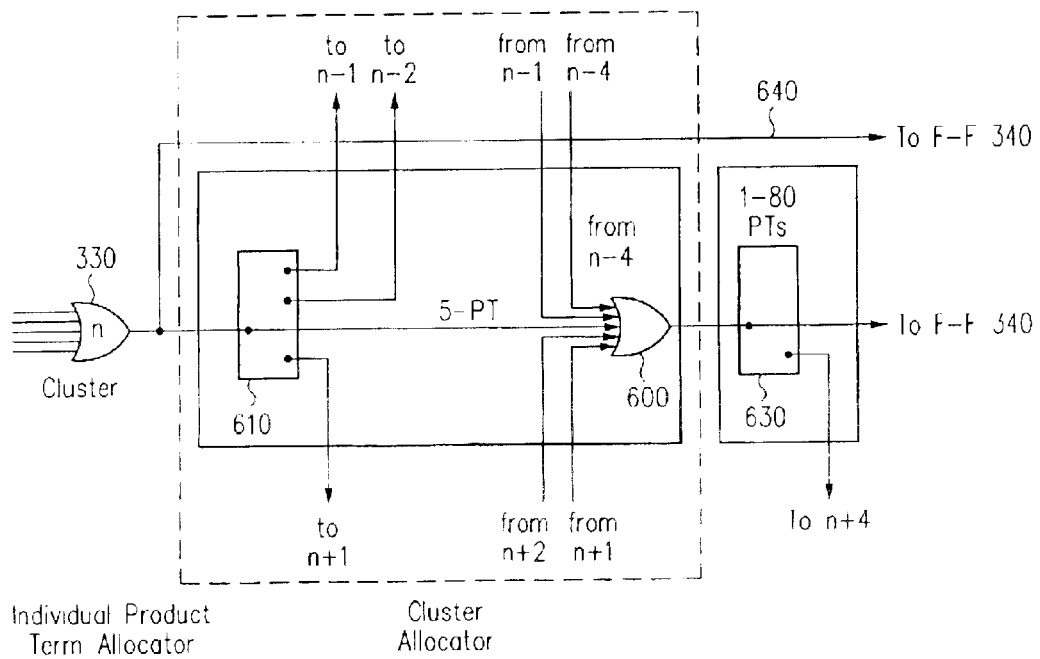
FIG. 6 illustrates a cluster steering architecture for a logic block of FIG. 3 according to one embodiment of the invention.

Without further provision for product term cascading within each logic block 301 (which may be denoted as intra-block depth cascading), the maximum logic depth available for each macrocell would be merely 5 product terms. However, several techniques may be used to cascade the product terms from programmable AND array 320 within a logic block 301. Turning now to FIG. 6, a product term cluster allocator scheme may be implemented between OR gate 330 and flip-flop 340 for each macrocell within a logic block 301. For generality, FIG. 6 illustrates OR gate 330 for an nth macrocell in a given logic block. The term "product term cluster" refers to the group of five product terms that may be summed in each OR gate 330. From each "nth" macrocell, the output from OR gate 330 (representing the sum of some or all of the product terms within a cluster) may be distributed to other macrocells within a logic block using a 1:M demultiplexer. For example, a 1:4 demultiplexer 610 may receive the output of OR gate 330 for the nth macrocell and distribute the output to either the (n−1)th, (n−2)th, nth, or the (n+1)th macrocell. An additional OR gate 600 may sum the outputs from associated OR gate 330 (the association being that both OR gates 600 and 330 correspond to the same macrocell) as received from 1:4 demultiplexer 610 and similarly sum the outputs from neighboring OR gates 330 for the (n−1)th, (n+2)th, and (n+1)th macrocells to provide cascading. In addition, OR gate 600 may sum the output of the (n−4)th macrocell. It will be appreciated that these neighboring macrocells are obtained in a "wraparound" fashion. For example, with respect to macrocell 15, the (n+1)th macrocell would be macrocell 0. A 1:2 demultiplexer 630 receives the output from OR gate 600 and directs the output to the associated macrocell's flip-flop 340 or to the OR gate 600 in the (n+4)th macrocell, depending upon the desired selection. Should a user desire a narrow logic function that doesn't need cascading, a fast bypass path 640 may be selected for to couple the output of OR gate 330 to its macrocell's flip-flop 340.

Figure 7:
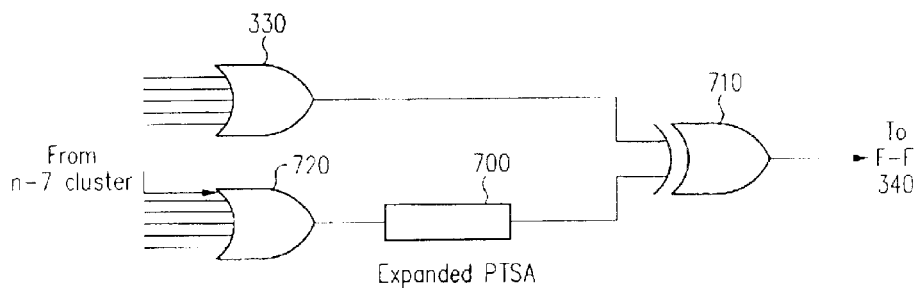
FIG. 7 illustrates a product term sharing architecture for a logic block of FIG. 3 according to one embodiment of the invention.
Figure 8:
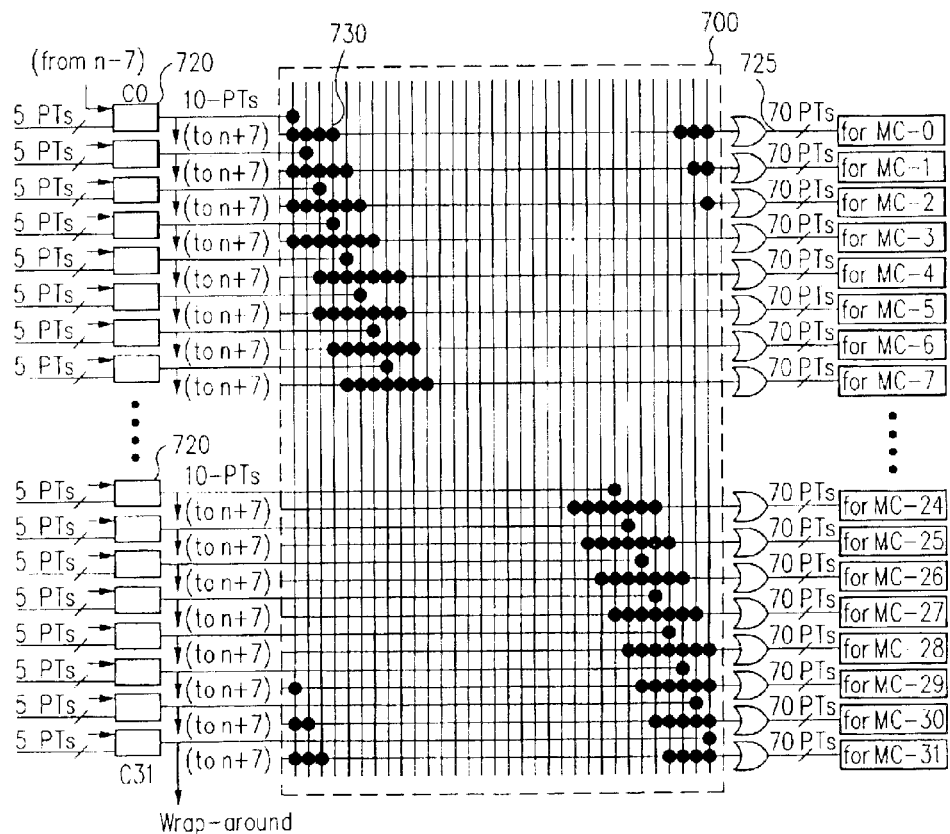
FIG. 8 illustrates an architecture for the expanded product term sharing array of FIG. 7.

As an alternative to the product term cluster steering approach discussed with respect to FIG. 6, a product term sharing approach may also be implemented to cascade product terms within a logic block. Although this product term sharing approach will be discussed with respect to logic block having 32 macrocells, it will be appreciated that this approach may be applied to a logic block having any desired plurality of macrocells. Turning now to FIGS. 7 and 8, a product term sharing array 700 for implementing this product term sharing approach is shown. FIG. 7 illustrates the relationship of product term sharing array to an nth macrocell's flip-flop 340 (FIG. 4). As discussed previously, flip-flop 340 may register the output of its corresponding OR gate 330. In this fashion, flip-flop 340 register the sum of its corresponding cluster of 5 product terms. However, through an XOR gate 710, flip-flop 340 may also register a corresponding output of product term sharing array 700. Product term sharing array 700 may comprise a partially-populated switch matrix having 32 outputs 725 corresponding to the 32 macrocells. Each macrocell includes an additional OR gate 720 that may sum its cluster of five product terms. In addition, OR gate 720 may also sum the output of the (n−7)th macrocell's OR gate 720. Consider the situation if the (n−7)th OR gate 720 output is not fused into OR gate 720

(the corresponding fuse points are not illustrated). In this case, each OR gate 720 provides the same sum that OR gate 330 does. With respect to an nth macrocell, the output of its OR gate 720 may be fused through product term sharing array 700 to XOR gate 710 and ultimately to the D input of the corresponding flip-flop 340. In addition, product term sharing array may fuse in (using fuse points 730), the outputs of neighboring macrocell's OR gates 720. For example, with respect to an nth macrocell, product term sharing array 720 may fuse in the outputs of the (n−3)th, (n−2)th, (n−1)th, nth, (n+1)th, (n+2)th, and the (n+3)th macrocell's OR gate 720. It will be appreciated that the number of product term sums that may be fused into product term sharing array 700 is arbitrary and may be varied. For instance, in an alternate embodiment of product term sharing array 700, just three sums could be fused such that with respect to an nth macrocell, the outputs of the (n−1)th, nth, and (n+1)th macrocell's OR gate 720 may be summed. In turn, the number of product term sums that may be fused into product term sharing array 720 with respect to any macrocell drives the macrocell-number-offset for the additional input to OR gate 720 besides the 5 product terms corresponding to the macrocell. In other words, with respect to an nth macrocell, if product term sharing array 720 may fuse in X outputs, then the macrocell offset for the additional input to OR gate 720 is (n−X). From product term sharing array 700, the sum of 7*5=35 product terms may be registered at each macrocell. However, because OR gate 720 may also sum the output of the (n−7)th macrocell's OR gate 720, this sum may be incremented by 35 product terms such that each macrocell may register the sum of 70 product terms. Note that this depth cascading is uni-directional and wraps-around the macrocells. For example, with respect to macrocell MC-0, it may sum the 35 product terms corresponding to macrocells MC-29, MC-30, MC-31, MC-0, MC-1, MC-2, and MC-3. Should each of these macrocell's OR gate 720 sum the output of the (n−7)th macrocell's OR gate 720, MC-0 would sum not only these 35 product terms but the 35 product terms corresponding to macrocells MC-22, MC-23, MC-24, MC-25, MC-26, MC-27, and MC-28 as well. In turn, the OR gates 720 at MC-22 through MC-28 may also sum the outputs of the (n−7)th macrocell's OR gates 720. Each extra increment of 35 product terms demands the processing time needed to sum the product terms in the (n−7)th macrocells. If this processing time is denoted as a "unit delay" It follows that the product terms may be cascaded as:

One unit delay to get 70 PTs

Two unit delay to get 105 PTs, and so on such that a

Nine unit delay gets 320 PTs.

Inter-block Cascading

Figure 1:
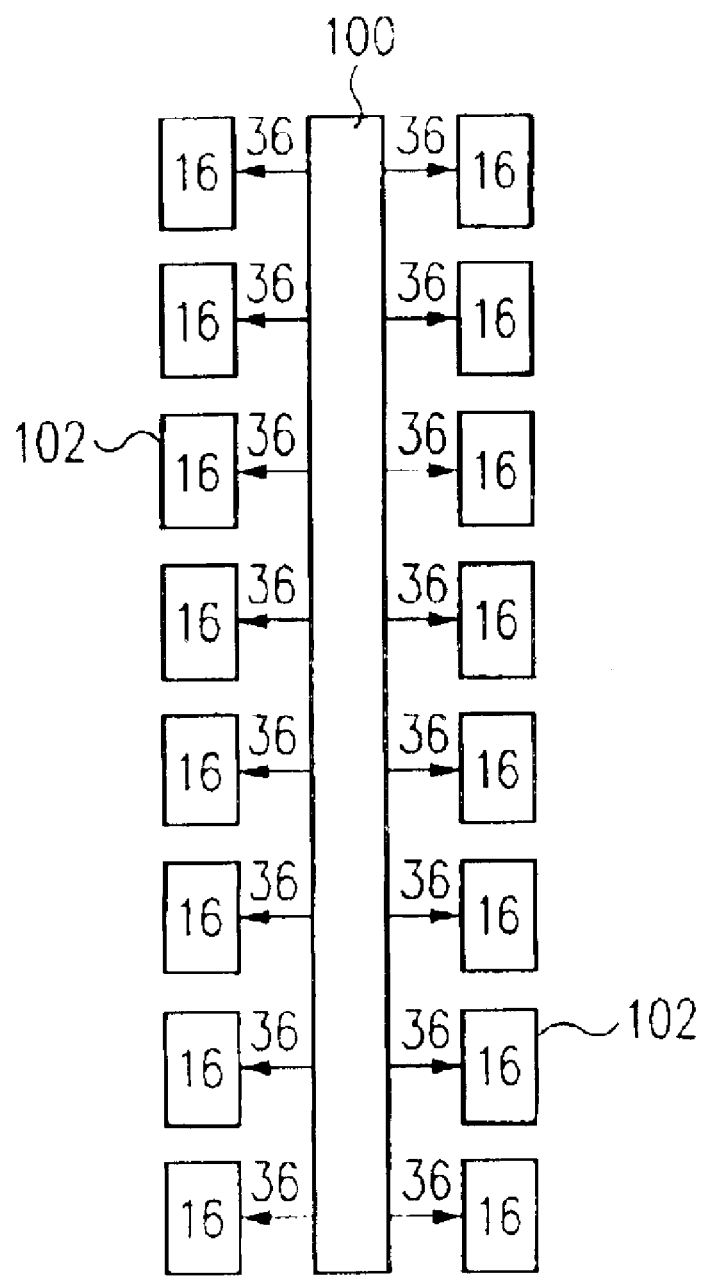
FIG. 1 is a block diagram of a conventional complex programmable logic device (CPLD).
Figure 2A:
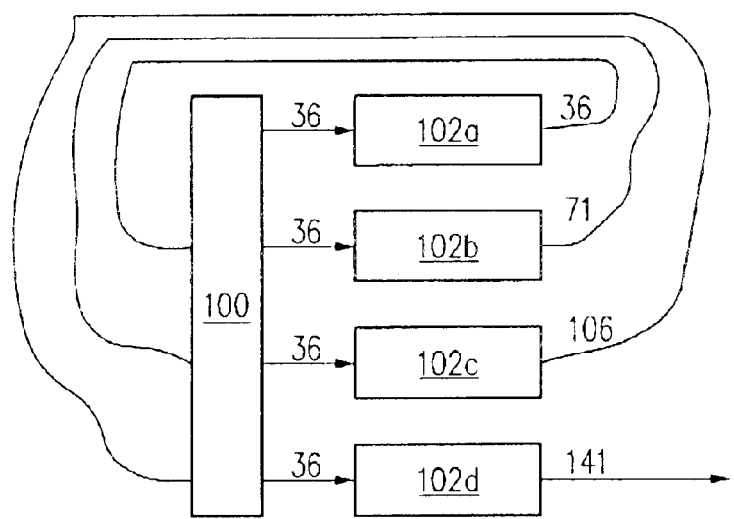
FIG. 2a illustrates a conventional input width cascading using the routing structure.
Figure 2B:
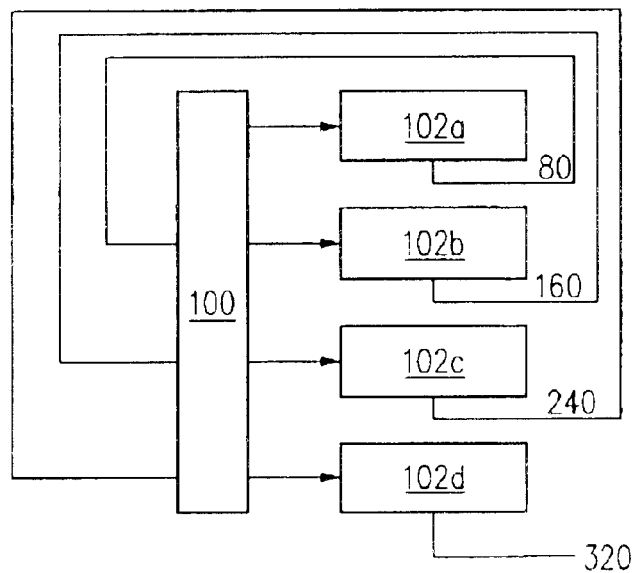
FIG. 2b illustrates a conventional product term cascading using the routing structure.
Figure 9:
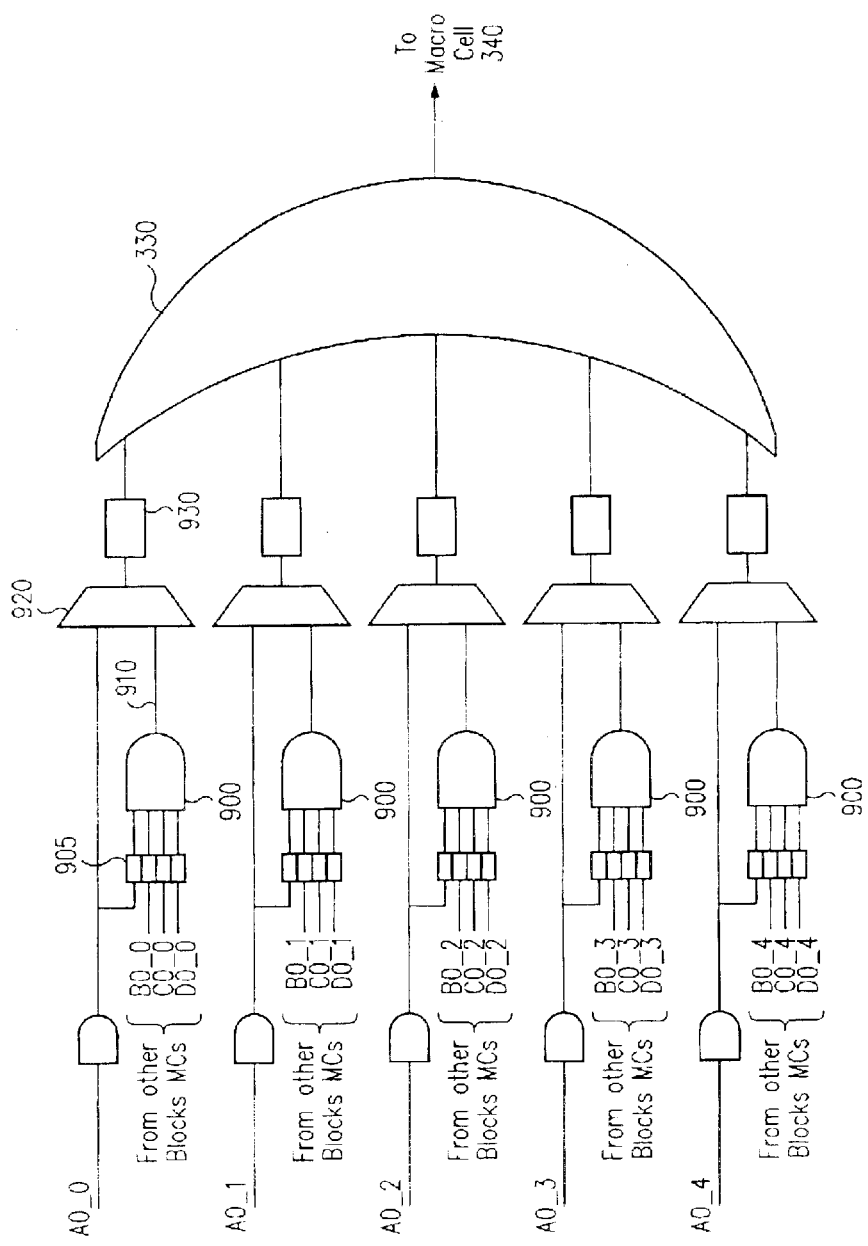
FIG. 9 is a schematic for an input-width cascading approach for the logic blocks of FIG. 3 according to one embodiment of the invention.

Having described how intra-block depth cascading may be performed with respect to FIGS. 6 through 8, inter-block width and depth cascading may now be addressed. In contrast to the prior art discussed with respect to FIGS. 2*a* and 2*b*, the inter-block cascading is "directly coupled" in that no cascading through the routing structure is necessary, thereby eliminating the routing delay and routing burden associated with these prior art approaches. Inter-block width cascading will be addressed first. Referring back to FIG. 3, inter-block width cascading across a cluster 305 may be accomplished using dedicated logic gates (described below with respect to FIG. 9) coupling the product term term outputs of the various logic blocks. As discussed with respect to FIG. 4, each logic block 301 may produce a plurality such as 80 product terms from its programmable AND array 320. Referring now to FIG. 9, the 80 product terms from four logic blocks 301 within a cluster 305 may be designated as A0_0 through A0_79, B0_0 through B0_79, C0_0 through C0_79, and D0_0 through D0_79, respectively, where one logic block 301 is designated as the "A" block, another the "B" block, another the "C" block, and the remaining one the "D" block. Thus, with respect to macrocell 0 (FIG. 4) of the A block, its cluster of product terms that may be summed at its OR gate 330 is the set of A0_0 through A0_4. Similarly, with respect to macrocell 0 of the B block, its corresponding cluster of product terms is the set of B0_0 through B0_4, and so on with respect to the C and D blocks. Using AND gates 900, each product term within a cluster for one logic block 301 may be "ANDed" with the corresponding product terms in the remaining logic blocks 301 within a cluster 305. A given product term may be "fused" as an input to AND gate 900 using fuse points 905. As discussed with respect to FIGS. 3 and 4, each product term within the cluster supplied to OR gate 330 has a fixed input width (for example, 36 inputs) determined by the configuration of routing structure 310. Accordingly, the input width of the product term output 910 provided by AND gate 900 may be increased in 36 input increments as additional product terms are fused in from other logic blocks within a cluster 305. Should a user desire a narrow logic function that may be implemented using the cluster of product terms corresponding to a given OR gate 330, a multiplexer 920 may be used to select between narrow and wide logic modes. In the narrow mode, multiplexer 920 selects directly for the product terms corresponding to its OR gate 330. In the wide mode, multiplexer 920 selects for the product term output 910 from AND gate 900. The product terms from multiplexers 920 may couple to OR gate 330 which then sums the product terms so they may couple to the corresponding macrocell's flip-flop 340. Alternatively, fuses 930 may be activated to select for a product term sharing array (discussed further below). It will be appreciated that multiplexers 920 are optional in that a narrow mode could also be implemented by fusing in at AND gates 900 only those product terms within the product term cluster corresponding to OR gate 330. However, multiplexers 920 avoid the delay of coupling through AND gate 900 if a narrow logic mode is desired.

Figure 10A:
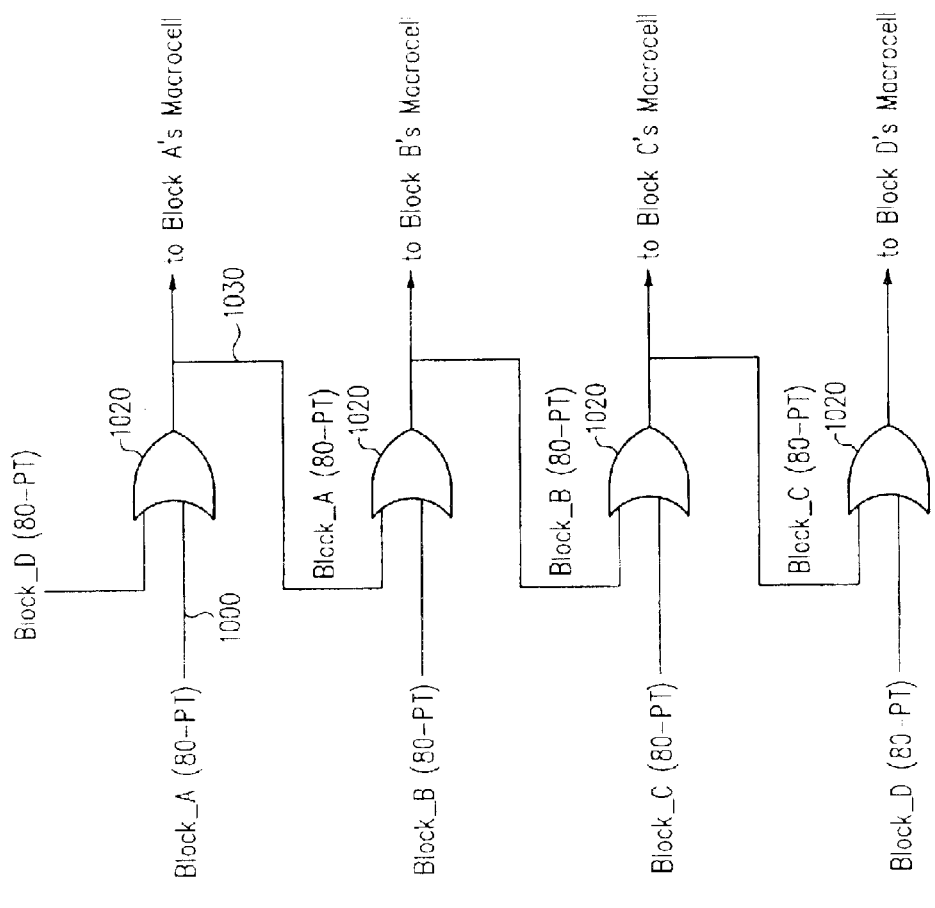
FIG. 10a is a schematic for a depth cascading approach for the logic blocks of FIG. 3 according to one embodiment of the invention.
Figure 10B:
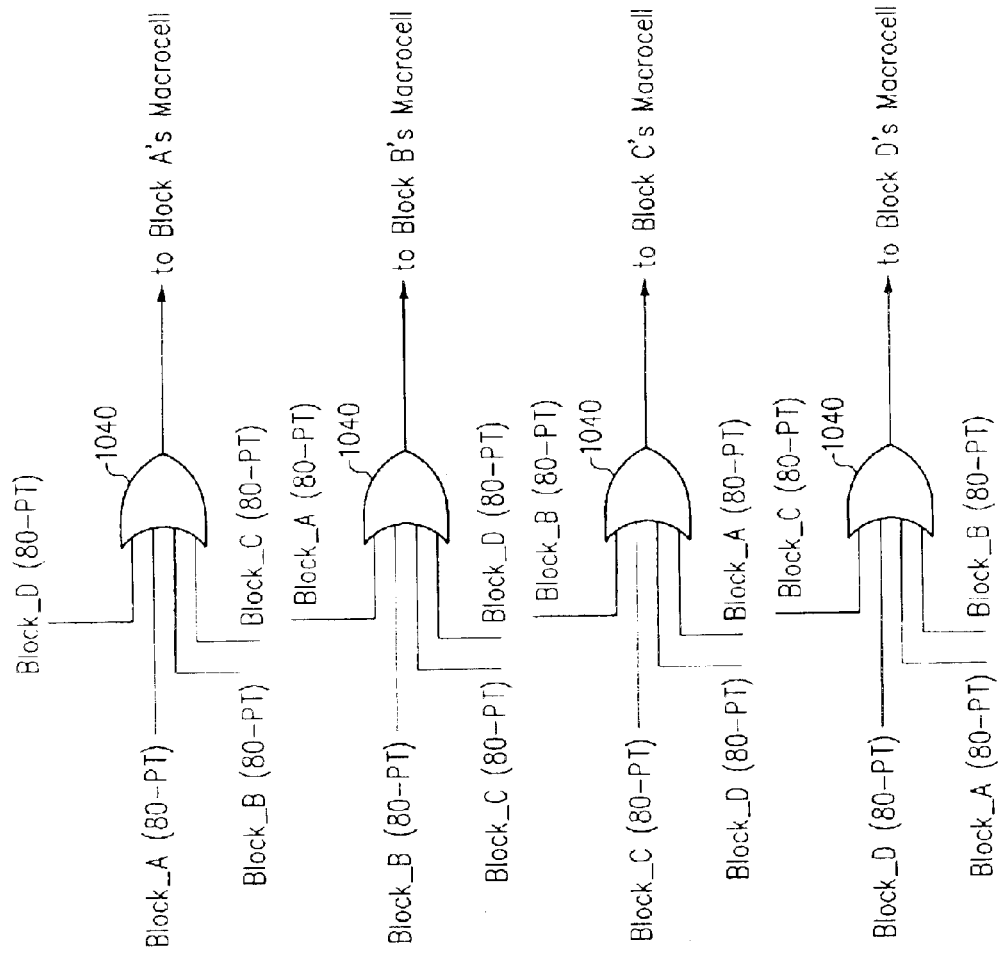
FIG. 10b is a schematic for a depth cascading approach for the logic blocks of FIG. 3 according to one embodiment of the invention.

Depth cascading across logic blocks may be accomplished in several ways. Turning now to FIGS. 10*a* and 10*b*, logic gates may be used to provide inter-block depth cascading in a first approach. Recall that as discussed with respect to FIGS. 6 and 7, two techniques may be used to perform intra-block depth cascading. For example, if 80 product term outputs are available from a programmable AND array 320, these 80 product terms may be summed using these two techniques. As shown in FIGS. 10*a*, the resulting sum of eighty product terms (80-PTs) 1000 may be received al two-input OR gates 1020. In turn, output 1030 of each OR gate 1020 may be cascaded as an input 1030 to a neighboring logic block's OR gate 1020. Because each OR gate 1020 has just two inputs, this cascading occurs in a uni-directional fashion. In other words, 80-PT sum 1000 from logic block A may pass through its OR gate 1020 and pass as input 1030 to logic block B's OR gate 1020. Similarly, the 80-PT sum 1000 from block B cascades to block C, the 80-PT sum 1000 from block C cascades to block D, and the 80-PT sum 1000 cascades in a wrap-around fashion to block A. In this fashion, depth cascading across the logic blocks may occur in 80-PT increments to the maximum of 320 PTs. It will be appreciated that for illustration clarity, FIG. 10*a* illustrates OR gates 1020 for just one macrocell per logic block. However, each macrocell may associate with its own cascading OR gate 1020. Thus, an 80-PT sum at macrocell 0 in logic block A may cascade to sum with the 80-PT sum available at macrocell 0 in logic block B, and so on for the remaining macrocells.

Turning now to FIG. 10*b*, using OR gates 1040 having more than two inputs allows bi-directional depth cascading. In other words, the 80-PT sum 1000 from block A may cascade to block D and vice-versa. If cluster 305 is formed from four logic blocks 301, a four-input OR gate 1040 assures bi-directional product term cascading between all four logic blocks 301. Alternatively, if a three-input OR gate (not illustrated) were used instead of four-input OR gate 1040, with respect to any given logic block 301, the bi-directionality would exist only between one of the remaining logic blocks 301 in cluster 305. With four-input OR gate 1040, product terms may be cascaded in 240 product term increments to achieve the maximum of 320 product terms. Comparing the summation speed of the various OR gates, 4-input OR gate 1040 will achieve the maximum of 320 product terms with just the time delay needed to sum the 240 product term increment. With respect to the 80 product term increment of OR gate 1020, it may sum to only 160 product terms. Three-input OR gate would allow 160 product term increments to achieve a maximum of 240 product terms within the time delay needed to sum the 160 product term increment.

Figure 11:
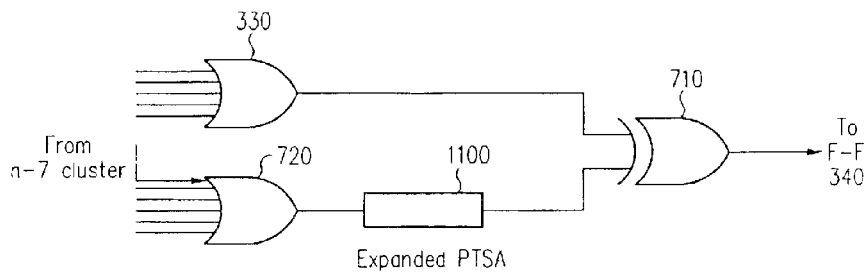
FIG. 11 illustrates a depth cascading architecture for a macrocell of FIG. 4 according to one embodiment of the invention.
Figure 12:
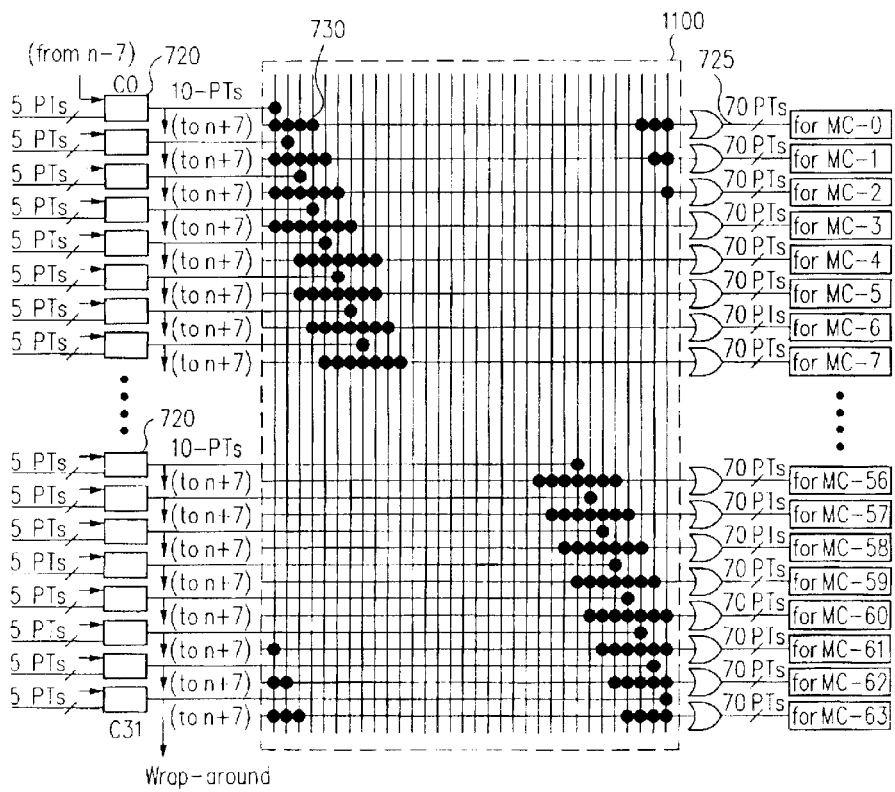
FIG. 12 illustrates the depth cascading architecture of FIG. 11 applied to all the macrocells in a logic block according to one embodiment of the invention.

In an alternative approach to product term cascading across cluster 305, the macrocells may be cascaded as one virtual block using the expanded product term sharing array approach discussed with respect to FIG. 8. Turning now to FIGS. 11 and 12, one embodiment of an expanded product term sharing array 1100 for the 64 macrocells within cluster 305 is illustrated. The product term sum from 5-input OR gate 330 is XORed with an product term sum output from expanded product term sharing array 1100 at XOR gate 710. The flip-flop 340 corresponding to OR gate 330 may register the output of XOR gate 710. In this fashion, the delay incurred through coupling through OR gate 720 and expanded product term sharing array 1100 may be avoided should a user desire a narrow (5-input or less) logic function. Expanded product term sharing array 1100 is similar to expanded product term sharing array 700 in that with respect to an nth macrocell, the preceding three macrocell's product term sum from OR gate 720 and the subsequent three macrocell's product term sum from OR gate 720 may be fused in at fuse points 730 in addition to the nth macrocells product term sum from its OR gate 720. It will be appreciated that the number of fuse points per macrocell in expanded product term sharing array 1100 may be varied according to a user's needs. In turn, the number of fuse points per macrocell in expanded product term sharing array 1100 drives the macrocell offset to the additional input to 6-input OR gate 720. Thus, with respect to an nth macrocell, there are X fuse points per macrocell, the offset would be (n–X). This offset wraps around the macrocell array. Thus, with respect to OR gate 720 for macrocell 0, the product term sum from macrocell 57's OR gate 720 is the additional product term input.

In another approach to achieving depth cascading by treating the macrocells within a cluster as being in one virtual logic block, the cluster steering approach described with respect to FIG. 6 may be implemented. It will be appreciated that the cluster steering approach illustrated in FIG. 6 may be modified. For example, OR gate 600 may be replace by an OR gate having fewer or more than 5 inputs.

Consider the advantages that flow from the embodiments of the invention described herein. The efficiency (reducing the fuse count) of the routing structure improves as the number of inputs are increased with respect to a logic block. In this regard, cluster 305 is a "large" virtual logic block with respect to the routing structure. With respect to a given logic block, however, its fuse efficiency increases as the number of macrocells is decreased. Accordingly, the present invention achieves the array efficiency of a "small" logic block yet also achieves the interconnect efficiency of a "large" logic block.

The above-described embodiments of the present invention are merely meant to be illustrative and not limiting. For example, 5-input OR gate 330 may be replaced by an OR gate having a different number of inputs. It will thus be obvious to those skilled in the art that various changes and modifications may be made without departing from this invention in its broader aspects. The appended claims encompass all such changes and modifications as fall within the true spirit and scope of this invention.

What is claimed is:

1. A programmable logic device, comprising:
   a routing structure configured to provide logical inputs;
   a plurality of logic blocks, each logic block including:
      a programmable AND array to provide a plurality of product terms from a plurality of the logical inputs provided by the routing structure, the plurality of product terms being arranged the same for each logic block; and
      an AND gate for each product term, each AND gate being operable to selectively receive its product term and/or the corresponding product terms in the remaining logic blocks, each AND gate thereby forming a cascaded product term based on the selected product terms, whereby for each product term received by the AND gate, the input width for the cascaded product term is incremented by the plurality of logical inputs.

2. The programmable logic device of claim 1, wherein each AND gate is operable to selectively receive its product term and/or the corresponding product terms in the remaining logic blocks through the operation of programmable fuses.

3. The programmable logic device of claim 1, wherein each logic block further comprises a plurality of macrocells, each macrocell coupling to a cluster OR gate operable to sum a cluster of the cascaded product terms from the AND gates such that each macrocell may register the sum of cascaded product terms from its cluster OR gate.

4. The programmable logic device of claim 1, wherein each logic block further comprises a plurality of macrocells, each macrocell coupling to an N-input cluster OR gate operable to sum a plurality of N of the cascaded product terms from the AND gates such that each macrocell may register the sum of cascaded product terms from its N-input cluster OR gate, the macrocells being arranged from a first macrocell to a last macrocell such that the first macrocell's N-input cluster OR gate may sum the first through the Nth cascaded product term, and so on.

5. The programmable logic device of claim 1, wherein each logic block further comprises a plurality of multiplexers corresponding on a one-to-one basis with the plurality of AND gates, wherein each multiplexer is operable to select between its AND gate's product term input and the cascaded product term output to provide a selected signal, and wherein each logic block includes a plurality of macrocells, each macrocell coupling to a cluster OR gate operable to sum a cluster of the selected signals such that each macrocell may register a sum of cascaded product terms or a sum of product terms, whereby the inter-logic-block width cascading provided by the plurality of AND gates may be bypassed.

6. The programmable logic device of claim 1, wherein each logic block further comprises:
- a plurality of macrocells, each macrocell coupling to a cluster OR gate operable to sum a cluster of the cascaded product terms from the AND gates such that each macrocell may register the sum of cascaded product terms from its cluster OR gate; and
- intra-block product term depth cascading circuitry configured to add the sums of cascaded product terms corresponding to the plurality of macrocells to form a depth cascaded sum of product terms, each macrocell being coupled to the intra-block product term depth cascading circuitry such that each macrocell may also register the depth cascaded sum of product terms.

7. The programmable logic device of claim 6, further comprising depth logic circuitry configured to provide inter-block depth cascading configured such that the depth cascaded sum of product terms from one macrocell in one logic block in the plurality of logic blocks may be directly cascaded through the depth logic circuitry to the corresponding macrocell in another logic block in the plurality.

8. The programmable logic device of claim 6, wherein each logic block further comprises a cascading OR gate for each macrocell, wherein each cascading OR gate is configured to receive its macrocell's depth cascaded sum of product terms and to receive the depth cascaded sum of product terms from the corresponding macrocell in at least one other logic block.

9. The programmable logic device of claim 6, wherein each logic block further comprises a 2-input cascading OR gate for each macrocell, wherein each 2-input cascading OR gate is configured to receive its macrocell's depth cascaded sum of product terms and to receive the depth cascaded sum of product terms from the corresponding macrocell in one other logic block.

10. The programmable logic device of claim 6, wherein each logic block further comprises a 3-input cascading OR gate for each macrocell, wherein each 3-input cascading OR gate is configured to receive its macrocell's depth cascaded sum of product terms and to receive the depth cascaded sum of product terms from the corresponding macrocell in two other logic blocks.

11. The programmable logic device of claim 6, wherein each logic block further comprises a 4-input cascading OR gate for each macrocell, wherein each 410 input cascading OR gate is configured to receive its macrocell's depth cascaded sum of product terms and to receive the depth cascaded sum of product terms from the corresponding macrocell in three other logic blocks.

12. The programmable logic device of claim 1, wherein each logic block further comprises a plurality of macrocells, each macrocell coupling to a cluster OR gate operable to sum a cluster of the cascaded product terms from the AND gates such that each macrocell may register the sum of cascaded product terms from its cluster OR gate; and wherein the programmable logic device further comprises inter-block depth cascading circuitry having a cascading OR gate for each macrocell and a product term sharing array, wherein each cascading OR gate is configured to sum the cascaded product terms summed by its macrocell's cluster OR gate and the output of another cascading OR gate and to provide a cascaded sum to the product term sharing array; wherein the product term sharing array is configured to, for each macrocell, add the cascaded sum with cascaded sums from other cascading OR gates to provide an inter-block depth cascaded sum of products output to the macrocell.

13. The programmable logic device of claim 12, wherein the product term sharing array comprises a partially populated switch matrix.

14. A method using a plurality of logic blocks, wherein each logic block has a programmable AND array configured to produce a plurality of product terms using a plurality of X logical inputs, and wherein each logic block includes a plurality of macrocells, each macrocell being configured to sum a subset of the plurality of product terms, the method comprising:
- cascading the sum of the subset of product terms from each macrocell at a first one of the logic blocks to form a first sum of product terms;
- cascading the sum of the subset of product terms from each macrocell at a second one of the logic blocks to form a second sum of product terms; and
- summing the first and second sum of product terms to form an inter-block cascaded sum of product terms.

15. The method of claim 14, further comprising:
- coupling the subset of product terms from a first macrocell in the first logic block to a second macrocell in the second logic block; and
- forming an inter-block width cascaded subset of product terms using the subset of product terms from each of the first and second macrocells, whereby the inter-block width is cascaded in an increment of X logical inputs.

16. A programmable logic device, comprising:
- a plurality of logic blocks, wherein each logic block includes a programmable AND array for forming product terms using a plurality of X logical inputs, and wherein each logic block includes a plurality of macrocells, each macrocell including an OR gate for summing a subset of product terms received from the programmable AND array; and
- means for input-width cascading between the logic blocks such that the input width of the product terms summed by each OR gate may be increased by increments of X logical inputs by directly coupling product terms through the means.

17. The programmable logic device of claim 16, wherein the means for input-width cascading is configured to provide bi-directional cascading between the logic blocks.

18. A programmable logic device, comprising:
- a plurality of logic blocks, wherein each logic block includes a programmable AND array for forming product terms using a plurality of X logical inputs, and wherein each logic block includes a plurality of macrocells, each macrocell including an OR gate for summing a subset of product terms received from the programmable AND array; and
- means for depth cascading between the logic blocks such that the sum of the subset of product terms from each macrocell may be incremented by the subset of product term increments by directly coupling the sums of the subsets of product terms through the means for depth cascading.

19. The programmable logic device of claim 17, wherein the means for depth cascading is configured to provide bi-directional cascading between the logic blocks.

20. The programmable logic device of claim 17, wherein the means for depth cascading is configured to provide unidirectional cascading between the logic blocks.

* * * * *

UNITED STATES PATENT AND TRADEMARK OFFICE
CERTIFICATE OF CORRECTION

PATENT NO.   : 6,922,078 B1  
DATED        : July 26, 2005  
INVENTOR(S)  : Om P. Agrawal It is certified that error appears in the above-identified patent and that said Letters Patent is hereby corrected as shown below:

Column 9,  
Line 43, "each 410 input" should be -- each 4-input --.

Signed and Sealed this

Twenty-seventh Day of September, 2005

JON W. DUDAS  
*Director of the United States Patent and Trademark Office*